United States Patent [19]

Muralidhar et al.

[11] Patent Number: 5,164,342
[45] Date of Patent: Nov. 17, 1992

[54] LOW DIELECTRIC, LOW TEMPERATURE FIRED GLASS CERAMICS

[75] Inventors: S. K. Muralidhar, Parma, Ohio; Aziz S. Shaikh, Ventura, Calif.; Gordon J. Roberts, Parma, Ohio; Dana L. Hankey, Santa Barbara; David J. Leandri, Goleta, both of Calif.; Thomas J. Vlach, Eastlake, Ohio

[73] Assignee: Ferro Corporation, Cleveland, Ohio

[21] Appl. No.: 604,344

[22] Filed: Oct. 24, 1990

Related U.S. Application Data

[63] Continuation of Ser. No. 258,303, Oct. 14, 1988, abandoned.

[51] Int. Cl.⁵ .................. C03C 4/16; C03C 10/04
[52] U.S. Cl. ............................ 501/20; 501/4; 501/5; 501/10; 501/16; 501/65; 501/72
[58] Field of Search ............... 501/4, 5, 10, 65, 77, 501/72, 16, 20

[56] References Cited

U.S. PATENT DOCUMENTS

| | | |
|---|---|---|
| 3,816,172 | 6/1974 | Hoffman . |
| 4,084,975 | 4/1978 | Faust ........................ 106/48 |
| 4,084,976 | 4/1978 | Hinton ....................... 106/48 |
| 4,301,324 | 11/1981 | Kumar et al. . |
| 4,323,652 | 4/1982 | Baudry et al. ............... 501/5 X |
| 4,413,061 | 11/1983 | Kumar et al. . |
| 4,435,511 | 3/1984 | Weaver ...................... 501/22 |
| 4,443,550 | 4/1984 | Kume et al. ................ 501/5 X |
| 4,532,221 | 7/1985 | Barlier et al. .............. 501/22 |
| 4,547,467 | 11/1985 | Barth et al. ................ 501/20 |
| 4,547,625 | 11/1985 | Tosaki et al. ............... 174/68.5 |
| 4,593,006 | 6/1986 | Takabatake et al. ......... 501/32 |
| 4,598,167 | 7/1986 | Ushifusa et al. . |
| 4,621,066 | 11/1986 | Nishigaki et al. . |
| 4,642,148 | 2/1987 | Kuriharn et al. . |
| 4,649,125 | 3/1987 | Takeuchi et al. ............ 501/15 |
| 4,654,095 | 3/1987 | Steinberg . |
| 4,672,152 | 6/1987 | Shinohara et al. ........... 174/68.5 |
| 4,714,687 | 12/1987 | Holleran et al. . |
| 4,749,665 | 6/1988 | Yano et al. ................. 501/65 X |
| 4,752,531 | 6/1988 | Steinberg ................... 428/426 |
| 4,764,233 | 8/1988 | Ogihara et al. ............. 156/89 |
| 4,816,615 | 3/1989 | Prabhu et al. ............. 174/68.5 |
| 4,830,988 | 5/1989 | Hang et al. ................ 501/21 |
| 4,849,379 | 7/1989 | McCormick ................ 501/20 |
| 4,861,646 | 8/1989 | Barringer et al. ........... 428/210 |

FOREIGN PATENT DOCUMENTS

| | | |
|---|---|---|
| 0209776 | 7/1986 | Fed. Rep. of Germany . |
| 0232767 | 1/1987 | Fed. Rep. of Germany . |
| 0071646 | 5/1980 | Japan ........................ 501/16 |

*Primary Examiner*—Karl Group
*Attorney, Agent, or Firm*—Renner, Otto, Boisselle & Sklar

[57] ABSTRACT

A low dielectric, low temperature fired glass ceramic produced by firing at about 800°–950° C. a mixture comprising at least one glass consisting of, by weight percent, 0 to 50% $B_2O_3$, 35 to 65% CaO, and 10 to 65% $SiO_2$ 1, and selected from the glasses of $CaO\text{-}B_2O_3\text{-}SiO_2$ glass system. The glass ceramic is light weight, exhibits a dielectric constant of less than about 5.2, has adequate mechanical strength and thermal conductivity, and is compatible with precious metal conductors. The glass ceramic is useful in the manufacture of integrated circuits and any other electronic or mechanical components where a glass ceramic exhibiting this particular combination of characteristics is suitable.

6 Claims, 3 Drawing Sheets

FIG. 4 a. COMPLETION OF VEHICLE VOLATILIZATION b. GLASS TRANSITION TEMPERATURE

FIG. 5

LOW DIELECTRIC, LOW TEMPERATURE FIRED GLASS CERAMICS

This is a continuation of copending application Ser. No. 07/258,303 filed on Oct. 14, 1988, now abandoned.

BACKGROUND OF THE INVENTION

1. Technical Field

This invention relates to low dielectric constant, low temperature fired glass ceramics especially useful in the manufacture of multilayer integrated circuits, thick film hybrid circuits and other electronic components, and comprising a glass from the $CaO-B_2O_3-SiO_2$ glass system.

2. Description of the related art

Cofired multilayer circuits (CMC) are known in the art. Advances in information processing technology have resulted in ever increasing numbers of circuit elements per unit area. A concurrent need for CMC substrates satisfying certain performance criteria has arisen. The desirable characteristics that a CMC substrate should exhibit are a low dielectric constant, a thermal expansion coefficient (CTE) matching that of the chip, high thermal conductivity and amenability to be processed into cofired multilayer circuits at low temperatures.

Multilayer circuits can be prepared from endless tapes containing dielectric material dispersed in a binder-solvent solution and cast onto an endless flexible film by techniques known in the art. Typical dielectric materials have included $Al_2O_3$ as a refractory filler or crystalline phase in a non-crystalline glass (glass/ceramic composite systems).

Composite ceramics incorporating alumina have been used as substrates for a long time. Current conductor, resistor and dielectric systems have properties, such as the coefficient of thermal expansion, matched to that of alumina. Early ceramics employing alumina required temperatures of 1400°-1500° C. for sintering. Such high temperatures presented problems well known in the art, such as limiting conductor metallurgy to refractory metals such as molybdenum and tungsten, the use of which presented the further problem of oxidizing at sintering temperatures. The oxidation of the conductor metals necessitated firing in a neutral $H_2$ atmosphere.

These difficulties lead to attempts at developing CMC substrate materials that could be fired at temperatures below about 950° C. where silver and copper can be used.

Glass ceramic composites were considered good candidates for CMC substrate materials because of low dielectric constants and low sintering temperatures. Glass ceramic composites, however, suffer the drawback of exhibiting low thermal conductivities. The current art, then, is comprised of composite materials that are the result of judicious compromises among the various requirements.

The speed of signal transmission in hybrid microelectronic circuits is affected by the dielectric constant of the insulating layer. Attempts at fabricating lower dielectric materials for use in thick film hybrid microcircuits have included polymeric dielectric materials, porous dielectric materials, and glass-ceramic composite dielectric materials.

The glass-ceramic composite materials have also been good candidates for thick film substrates because of their superior mechanical, electrical, and hermetic properties compared to porous dielectrics. They also have superior mechanical, physico-chemical, and refractory properties compared to polymeric dielectrics. The desirable characteristics that a glass-ceramic for use in thick film pastes should exhibit are a low dielectric constant, a thermal expansion coefficient (CTE) compatible with that of the substrate, excellent hermetic and insulating properties, compatibility with precious metal pastes, and amenability to be processed into thick film hybrid circuits at temperatures below about 950° C.

Thick film hybrid circuits can be prepared from inorganic powders made up into pastes with an organic vehicle; the pastes are applied to a suitable substrate, such as alumina, and then fired. Typical dielectric materials have included $Al_2O_3$ as a refractory filler or crystalline phase in a non-crystalline glass (non-crystallizing glass/ceramic composites).

U.S. Pat. No. 4,654,095 teaches such a dielectric composition for use in tapes in the fabrication of multilayer circuits wherein selected non-crystallizing glass having certain deformation and softening temperatures are mixed with a refractory filler that is insoluble in the glass, and then fired at 825° C.–900° C.

U.S. Pat. No. 4,642,148 describes a multilayer system requiring a two-stage firing in which the substrate is composed of alumina, a crystallizable glass such as crystallizing spodumene or cordierite, and a non-crystallizing soft glass such as borosilicate or aluminosilicate glass.

U.S. Pat. No. 4,621,066 teaches low temperature fired (800° C. to 1000° C.) composite ceramics for use in electronic components wherein non-crystalline glass from the $CaO-SiO_2-Al_2O_3$ system is mixed with 35 to 50% alumina.

U.S. Pat. No. 4,598,167 teaches composite ceramic substrate materials that are mixtures of a low temperature softening glass and various forms of $SiO_2$, and sinterable at temperatures below about 900° C. The dielectric constants are reported to be in the range of 4–6, and the CTE in the range of 4.5 to 7.0 ppm/° C.

U.S. Pat. Nos. 4,413,061 and 4,301,324 describe two glass ceramic systems having spodumene and cordierite as the main crystallizing phases. The dielectric constants are reported as in the range of 5.0 to 6.5, and the CTE as in the range of 2.0 to 8.3 ppm/° C.

U.S. Pat. No. 3,816,172 teaches a partially crystallized dielectric comprising glass crystals in a glassy matrix.

U.S. Pat. No. 4,714,687 teaches a low k glass ceramic suitable for dielectric substrates and comprising willemite and cordierite.

SUMMARY OF THE INVENTION

The invention provides a low dielectric constant, low temperature fired glass ceramic produced by firing at about 800° to 950° C., a mixture comprising at least one glass having a composition of, by weight percent, 0 to 50% $B_2O_3$, 35 to 65% CaO, and 10 to 65% $SiO_2$, and selected from the $CaO-B_2O_3-SiO_2$ glass system. The invention also provides a two-glass (binary) ceramic wherein a hard and a soft glass selected from the $CaO-B_2O_3-SiO_2$ system are fired together to form a ceramic article. The invention further provides a non-crystallizing glass/glass ceramic comprises a crystallizable glass from the $CaO-B_2O_3-SiO_2$ system having a composition of, by weight percent, about 18 to 32% $B_2O_3$, about 42–47% CaO, and about 28 to 40% $SiO_2$, a non-crystallizing glass having a composition of, by weight percent, at least about 60% $SiO_2$, about 10 to 35% $B_2O_3$, and up to about 6% alkali metal oxide. The CMC glass ceramics exhibit dielectric constant values of less than about 7.0. The dielectric constant of the thick film materials is less than about 5.2. The relative proportions of the glasses affect the final properties of the ceramic, such as the thermal expansion coefficient, so that the thick film ceramic can be made compatible with various substrates, such as alumina, mullite, and spinel. The non-crystallizing glass/glass thick film ceramic dielectric material is useful as a multilayer dielectric, a cross-over dielectric, a solder dam, or a hermetic seal. The glass ceramics of the present invention are useful in any electronic or mechanical components where a glass ceramic exhibiting the particular combinations of characteristics is desirable.

As used in the specification and the claims, the terms "hard" and "soft," when applied to a pair of glasses in the $CaO-B_2O_3-SiO_2$ glass system, are used in a relative sense and with reference to the $CaO-B_2O_3-SiO_2$ glass system phase diagram, a hard glass being farther from the eutectic than its paired soft glass. Another relationship between a hard and a soft glass is that the hard glass has a liquidus temperature above that of the soft glass.

The glass ceramic of the present invention is to be distinguished from non-crystallizing glass and ceramic (refractory) filler preparations of the prior art. Unlike glass/ceramic composites wherein a refractory filler (ceramic) is mixed with a non-crystallizing glass in which it is insoluble to form a glassy matrix surrounding a refractory filler, the material of the present invention comprises a glass ceramic formed by the in situ crystallization of one or more crystallizable glasses from the same glass system.

The present invention also provides a non-crystallizing glass/glass ceramic dielectric material which is a dielectric material wherein a ceramic phase is dispersed in a glassy matrix where the ceramic if formed by the crystallization of the glass ceramic. Unlike glass-/ceramic composites wherein a refractory filler (ceramic) is mixed with a non-crystallizing glass in which it is insoluble to form a glassy matrix, this material of the present invention comprises a glass ceramic formed in situ by the crystallization of one glass in a non-crystallized matrix of another glass.

The glass ceramic of the present invention is advantageous for use in cofired multilayer substrates because it does not require a refractory ceramic component that can contribute to an increase in the dielectric constant. Additionally, the glass ceramic of the present invention, being composed of one or more crystallizing glasses from the $CaO-B_2O_3-SiO_2$ glass system, is free from problems caused by the interactions between refractory filler and glass. Yet when a refractory filler is needed or desired, the glasses are amenable to accepting such a filler.

Importantly, when two glasses are used to make a two-glass ceramic, the use of a hard glass and a soft glass from the same system means total compatibility, so that fine adjustments to the composition of the ceramic can be made during processing by simply adding more of one or the other of the glasses. The fact that both glasses in the two-glass ceramic are crystallizing results in a ceramic that is stable after the first fire. The use of two crystallizing glasses gives many options in the fabrication of the ceramics, such as using different grains sizes to achieve different rates of crystallization so as to change the amount of residual glass. Also, small amounts of lower dielectric constant fillers such as fused $SiO_2$, mullite, cordierite, fosterite and the like are easily tolerated by the system, yet allow for further manipulation of the properties of the final ceramic without encountering compatibility problems. The binary glass ceramic of the present invention simulates the use of refractory filler without the drawbacks associated with a glass/ceramic system.

A glass ceramic from a single glass from the $CaO-B_2O_3-SiO_2$ glass system also offers flexibility in the fabrication of substrates, such as the addition of hard or soft glasses from other systems. This other glass may be a non-crystallizing glass. The preferred non-crystallizing glasses exhibit a flat viscosity-temperature curve. Preferred non-crystalline glasses have high amounts of silica, fairly high boron trioxide contents, and alkali contents below about 6% by weight. Preferably, the glasses have a strain point between 440° and 480° C., an annealing point in the 480° to 530° C. range, and a fiber softening point between 690° and 785° C.

The one or two-glass ceramic of the present invention is lightweight, having a density lower than glass and alumina composite ceramic.

The thermal conductivity of the glass ceramics is adequate for use in microcircuits, and the thermal expansion matches that of alumina to a degree where available inks usually used for alumina CMC substrates may also be used with these ceramics.

The present glass ceramics enjoy compatibility with noble metals, so that silver, gold, and palladium, as well as copper conductors can be employed.

Upon firing, the present ceramics exhibit adequate dimensional stability, with XY shrinkage in the 12% range. Additionally, when made up as thick films, they can be fired using a typical thick film firing profile.

CMC substrates prepared with a single glass comprise 0 to 50% $B_2O_3$, 35 to 65% CaO, and 10 to 65% $SiO_2$, more preferably comprise 0 to 40% $B_2O_3$, 35 to 55% CaO, and 10 to 50% $SiO_2$.

CMC substrates prepared from two glasses from the same system comprise up to about 50% by weight soft glass and about 50% by weight hard glass. The preferred composition comprises 40% of the eutectic glass, as on Table II, below, and 60% of the glass designated as CBS-1 on Table II and comprising 10% $B_2O_3$, 40% CaO, and 50% $SiO_2$.

CMC substrates fabricated from one crystallizing glass from the same system and a non-crystallizing glass from another system comprise about 50% by weight of each.

Thick film dielectric inks are fabricated from a crystallizing glass from the system of the present invention comprising about 18 to 32% $B_2O_3$, 42 to 47% CaO, and 29 to 40% $SiO_2$, and a non-crystallizing glass comprising at least about 60% $SiO_2$, about 10 to 35% $B_2O_3$ and up to about 6% Alkali metal up to about 5% $AL_2O_3$ and MgO may be added to the glass composition. Preferred thick film dielectrics comprise a crystallizing glass of about 26% $B_2O_3$, about 42% CaO, and about 32% $SiO_2$, and a non-crystallizing glass about 71% $SiO_2$, 26% $B_2O_3$, 0.5% $Na_2O$, 1.0% $K_2O$, 0.5% $Li_2O$ and include a crystallizing agent which may be $CaB_2O_4$ and may be present in an amount of about 1% by weight. If a colorant is desired, the preferred colorant is $Cr_2O_3$ and is present in an amount of about 0.5% by weight.

The glasses are in the form of powders, preferably having an average particle size of about 1 to 10 μm, and most preferably, 3 to 6 μm. The crystallizing agent for the thick film substrate is also in the form of a powder, preferably having an average particle size of 1 to 3 μm.

Up to about 5 % by weight aluminum, silicon, or magnesium oxide may be also present in the composition, these incidental amounts of these oxides being picked up in the milling process.

Still other features and advantages and a full understanding of the invention will become apparent to those skilled in the art from the following description of the preferred embodiments.

DESCRIPTION OF THE PREFERRED EMBODIMENTS

1. Tapes for cofired multilayer circuits.

Figure 1A:
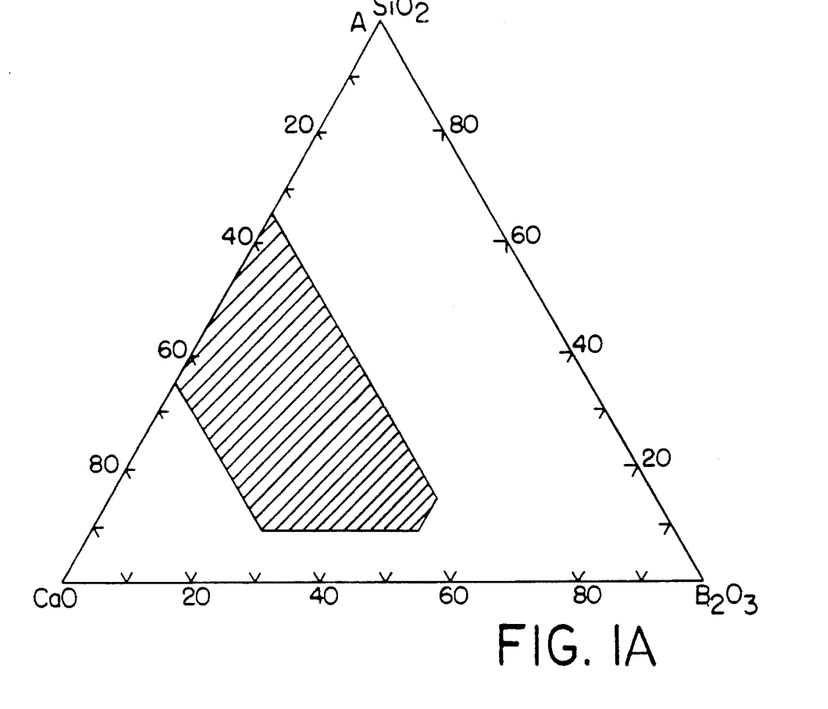
FIG. 1A is a phase diagram of the $CaO-B_2O_3-SiO_2$ system showing the composition range of the for CMC substrates.

Referring to FIG. 1A, there is shown a phase diagram of the $CaO-B_2O_3-SiO_2$ system showing the composition range of the glasses for the CMC substrates of the present invention. (The eutectic for the glass system is marked on FIG. 1B at 12).

For incorporation into dielectric compositions for use in tapes for cofired multilayer circuits, one or two glasses having a composition lying on the phase diagram of FIG. 1 and bounded by the limits 0 to 50% $B_2O_3$, 35 to 65% CaO, and 10 to 65% $SiO_2$ are milled to an appropriate size powder, about 1 to 10 μm average size, preferably in the range of 2 to 6 μm average size.

The powdered glass, with or without further refractory filler, is mixed with binder and then cast into a tape of desired thickness using a doctor blade, all by techniques known in the art. The binder may include a solvent, surfactant, plasticizer. Typical binders include acrylic binders and polyvinyl compounds. Plasticizers may include any of the phthalates. Additionally, viscosity modifiers, antiskinning agents and the like can be used, as is known in the art.

Table I lists the properties of one and two glass dielectric composition cofired multilayer tapes.

The composition of the glasses in the glass system column (1) of Table I are identified in Table II. The glasses of Table I were prepared as in Example 1.

EXAMPLE 1

The glass melting and milling procedure was of a type known in the art where glass was melted in a platinum crucible at 1400°–1500° C. for about one hour until it was fully melted and homogenized. The glass was poured through a set of rolls and rolled into flakes. The flakes were milled by known techniques to an average powder size of 2 to 6 μm. A binder solution, was prepared from, by weight, acrylic binder 11.33%; phthalate plasticizer 3.97%; and a solvent recommended by the suppliers, in this case a mixture of methyl ethyl ketone/-cyclohexane solvent, 84.7%. The powder was added to the binder so that the ratio of solids to liquid was about 60/40. The mixture was milled together in a ball mill with alumina media until a homogeneous slurry was obtained, that is for 2 to 24 hours. The resulting mixture was then degassed and cast into a tape using a doctor blade. The cast tape was dried and blanked. Blanked pieces were laminated in a laminating die at temperature of about 70° C. for 10 minutes at 3000 psi. The binder was burnt out at 350° C. for 12 hours. The laminate was fired on a setter in a belt furnace in a standard thick film profile of 850° C./10 minutes on an alumina substrate. The resultant substrate was then subjected to the measurements recorded in Table I.

TABLE I

| (1) System | (2) Appearance | (3) Edge Definition | (4) CTE 300 | (4) CTE 500 | (4) CTE 800 | (5) K | (6) D | (7) Porosity | (8) Sx | (8) Sy | (9) XRD phases |
| --- | --- | --- | --- | --- | --- | --- | --- | --- | --- | --- | --- |
| GROUP 1 | | | | | | | | | | | |
| 646/0 | White | Bad | 70.0 | 72.5 | 84.1 | | | | | | |
| P12-z | Gray | Bad | 73.4 | 76.7 | 86.3 | 5.203 | 0.0009 | | 13.5 | 14.3 | CS |
| K | Gray | Good | 71.3 | 74.1 | 82.7 | | | None | 20.8 | 18.2 | CS(M), CB(t), G |
| A | Gray | Good | | | | | | | | | |
| B | Gray | Good | | | | | | | | | CS(M), CB(m) |
| C | Gray | Good | 67.1 | 70.4 | 81.5 | | | | 19.3 | 14.2 | CS(M), CB(m) |
| D | Gray | Good | 63.6 | 69.6 | 81.5 | | | | 17.7 | 14.4 | CS(M), CB(m) |
| E | Gray | Bad | 66.4 | 71.7 | 83.3 | | | | 19 | 16.6 | U |
| F | Gray | Bad | | | | | | | | | CS(M), CB(M) |
| G | Gray | Bad | | | | | | | | | |
| N | Gray | Bad | 82.1 | 87.9 | 99.0 | | | None | 17.4 | 17.6 | CS(M), CB(m), G |
| O | Gray | Bad | 75.0 | 79.2 | 86.7 | | | None | 15 | 18.2 | CS(M), CB(m), C2B(m), G |
| T | Gray | Bad | 79.0 | 81.1 | 82.7 | | | None | 15 | 20.0 | CS(M), CB(m), C2B(m) |
| AA | Gray | Good | 42.6 | 45.5 | 46.8 | | | None | 19 | 15.4 | CS(M), CB(m), C2B(t), G |
| AB | Gray | Good | 65.7 | 72.5 | 84.1 | | | None | 19.7 | 15.1 | CS(M), CB(M), G |
| AC | Gray | Good | 65.7 | 75.4 | 85.8 | | | None | 22.4 | 19.6 | CS(M), CB(M), C2S(t), G |
| AD | Gray | Good | 102.9 | 106.7 | 113.7 | | | Little | 21.5 | 21.9 | C2S, CS, CB(m), C2BS(t) |
| AE | Gray | Good | 99.3 | 106.3 | 121.5 | | | Yes | | | |
| 20D | White | Good | 66.9 | 68.6 | 68.4 | 4.975 | 0.0003 | Yes | 8.36 | 9.93 | CS, CB |
| 20E | Gray | Good | 77.0 | 75.8 | 76.8 | | | Yes | | | |

TABLE I-continued

| (1) System | (2) Appearance | (3) Edge Definition | (4) CTE 300 | CTE 500 | CTE 800 | (5) K | (6) D | (7) Porosity | (8) Sx | Sy | (9) XRD phases |
|---|---|---|---|---|---|---|---|---|---|---|---|
| 20F | Gray | Good | 80.7 | 81.3 | 84.2 | 7.382 | 0.0017 | Yes | 13.7 | 15.7 | CS, CB, U |
| 20G | Gray | Good | 87.1 | 84.2 | 83.4 | 7.466 | 0.0071 | Yes | 16 | 11.2 | CS, U |
| 20H | Gray | Good | 105.3 | 112.1 | 121.1 | | | Yes | | | |
| 20I | Gray | Good | | | | | | Yes | | | |
| 30B | White | Bad | | | | | | None | | | |
| 30C | Gray | Good | 69.6 | 73.6 | 87.3 | | | Yes | | | |
| 30D | Gray | Good | 99.3 | 96.7 | 97.1 | | | Yes | | | |
| 30E | Gray | Good | 80.0 | 62.1 | | | | Yes | | | |
| 30F | Gray | Good | 73.2 | 60.7 | 67.9 | | | Yes | | | |
| 40C | Gray | Good | | | | | | 29.9 | 8.87 | 6.64 | |
| 40D | Gray | Good | 86.6 | 86.7 | 92.4 | 4.729 | 0 | Yes | 15.4 | 11.8 | |
| 40E | Gray | Good | 93.5 | 95.1 | 102.7 | 5.009 | 0.0035 | Yes | 17.4 | 17.6 | |
| AS1 | White | Good | 67.1 | 65.8 | 74.9 | | | None | | | |
| AS2 | White | Good | 66.0 | 68.5 | 87.6 | 6.21 | 0.0013 | None | 10.8 | 12.9 | CB(M), CS(t), C2S(t) |
| AS3 | White | Good | 70.0 | 71.3 | 93.3 | 6.21 | 0.0013 | None | 11 | 12.6 | CB, G |
| 15A | White | Good | 74.2 | 74.5 | 80.8 | | | Yes | | | CS(M), CB(m), G |
| 25A | White | Good | 75.6 | 74.0 | 74.9 | 5.756 | 0.0018 | None | N/M | N/M | CS(M), CB(m), G |
| 22.5A | White | Good | 80 | 76.7 | 82.3 | 6.29 | 0.0082 | 12.5 | 15.9 | 11.1 | |
| EUT12 (E12) | White | Bad | 77.6 | 83.7 | 97.6 | | | | N/M | N/M | CB(M), CS(m), G |
| CBS-1 | White | Good | 63.3 | 58.9 | 66.1 | | | Yes | 2.53 | 5.0 | |
| CBS-2 | White | Good | 74.9 | 75.4 | 82.3 | 5.44 | 0 | Yes | 11.5 | 18.2 | |
| CBS-3 | White | Good | 72.3 | 71.6 | 75.1 | | | Yes | 4.33 | 2.7 | |
| CBS-4 | Sl. Gray | Bad | 75.6 | 75.8 | 83.6 | 6.6 | 0 | 11.6 | 16.6 | 14.6 | |
| GROUP II | | | | | | | | | | | |
| CBS-1 + 10% E12 | White | Good | | | | | | 25.63 | 6.27 | 4.7 | |
| CBS-1 + 20% E12 | White | Good | 76.4 | 73.8 | 79.7 | 5.26 | 0.0009 | Yes | 9.07 | 7.6 | |
| CBS-1 + 30% E12 | White | Good | 80.0 | 77.1 | 82.6 | 5.7 | 0.001 | 26.1 | 11 | 10.3 | |
| CBS-1 + 35% E12 | White | Good | 80 | 80.4 | 84.2 | 5.455 | 0.0009 | Little | 11.8 | 10.3 | |
| CBS-1 + 40% E12 | White | Good | 75.5 | 76 | 82.1 | 5.298 | 0.0011 | 11.7 | 11.7 | 8.8 | |
| 15A + 10% 30B | White | Good | | | | | | Yes | 6.2 | 5.6 | |
| 15A + 20% 30B | White | Good | | | | | | Yes | 9 | 7.3 | |
| 15A + 30% 30B | White | Good | 74.2 | 74.5 | 80.8 | 5.58 | 0.0013 | Little | 10.8 | 8.9 | |
| 15A + 35% 30B | White | Good | 62.2 | 62.6 | 74.6 | 5.529 | 0.0006 | Little | 11.7 | 10.8 | |
| 15A + 40% 30B | White | Good | 75.7 | 74.6 | 86.2 | 5.646 | 0.003 | None | 12.6 | 11.2 | |
| 15A + 20% E12 | White | Good | | | | 4.822 | 0.0022 | 19.6 | 9.2 | 7.4 | |
| 15A + 25% E12 | White | Good | | | | | | | 10.4 | 9.5 | |
| 15A + 30% E12 | White | Good | | | | | | | 11.4 | 9.8 | |
| 20D + 15% E12 | White | Bad | | | | 6.504 | 0.0016 | 9.5 | 12.5 | 8.4 | |
| 20D + 20% E12 | White | Bad | | | | | | | 12.5 | 8.7 | |
| 20D + 25% E12 | White | Bad | | | | | | | 11.8 | 8.6 | |
| 646/0 + 20% 15A | White | Bad | | | | | | | 20 | 14.1 | |
| 646/0 + 25% 15A | White | Bad | | | | | | | 16.9 | 12.6 | |
| 646/0 + 30% 15A | White | Bad | | | | | | | 16.2 | 13.6 | |
| GROUP III | | | | | | | | | | | |
| 25A + 10% VYCOR | White | Good | | | | 6.34 | 0.0018 | Little | 14.3 | 11.7 | |
| 25A + 20% VYCOR | White | Good | | | | | | Yes | 9.67 | 8.1 | |
| 25A + 30% VYCOR | White | Good | | | | | | Yes | 3.73 | 3.1 | |
| 30B + 10% FS | White | Good | | | | 5.166 | 0.0023 | Little | 25.2 | 19.3 | CB(M), CS(m), Alpha Q(m) |
| 30B + 20% FS | White | Good | | | | 5.443 | 0.0018 | Little | 15.6 | 17.7 | CB(M), CS(m), Alpha Q(m) |
| 30B + 30% FS | White | Good | | | | | | Yes | | | CB(M), CS(m), Alpha Q(m) |
| 646/0 + 10% FS | White | Bad | | | | 5.682 | 0 | 17.8 | 18 | 15.1 | |
| 646/0 + 20% FS | White | Bad | 69.8 | 69.1 | 75.4 | 5.515 | 0.0038 | 13 | 13.4 | 12.3 | |
| 646/0 + 30% FS | White | Fair | | | | | | Yes | 8.8 | 9.3 | |
| 15A + 5% 7070 | White | Good | | | | 4.34 | 0.0023 | Yes | 6 | 7.8 | |
| 15A + 10% 7070 | White | Good | | | | | | Yes | 7.07 | 6.1 | |
| 15A + 15% 7070 | White | Good | | | | | | Yes | 9 | 8.4 | |
| 25A + 10% FS | White | Good | 80.7 | 78.3 | 86.5 | 6.63 | 0.0017 | 15.4 | 17.8 | 15.4 | |
| 25A + 20% FS | White | Good | 102.5 | 101.9 | 86.5 | 6.16 | 0.0019 | Yes | 15.1 | 13.8 | |
| 25A + 30% FS | White | Good | 76.4 | 73.4 | 88.5 | 4.7 | 0.0016 | 26.8 | 14.1 | 15.4 | |
| E12 + 10% FS | White | Good | 91.6 | 91.0 | 91.1 | 5.11 | 0.0014 | Little | 21.4 | 16.5 | |
| E12 + 12% FS | White | Good | 97.5 | 99.4 | | 6.872 | 0.0017 | 11.47 | 13.3 | 12 | |
| E12 + 15% FS | White | Good | 96.7 | 99.4 | | 6.276 | 0.0018 | Yes | 13.9 | 9.6 | |
| E12 + 20% FS | White | Good | | | | | | Yes | 12.2 | 12.0 | |
| E12 + 30% FS | White | Good | | | | | | Yes | 9.13 | 8.9 | |

TABLE II

| System | CaO | B2O3 | SiO2 |
|---|---|---|---|
| 646/0 | 45.00 | 15.00 | 40.00 |
| P12-z | | | |
| K | 47.72 | 8.34 | 43.95 |
| A | 47.52 | 11.12 | 41.36 |
| B | 47.33 | 13.90 | 38.78 |
| C | 47.13 | 16.68 | 36.19 |
| D | 46.94 | 19.46 | 33.61 |
| E | 46.74 | 22.24 | 31.02 |

TABLE II-continued

| System | CaO | B2O3 | SiO2 |
|---|---|---|---|
| F | 46.55 | 25.02 | 28.44 |
| G | 46.35 | 27.80 | 25.85 |
| N | 51.00 | 21.00 | 28.00 |
| O | 54.00 | 18.00 | 28.00 |
| T | 55.00 | 20.00 | 25.00 |
| AA | 50.00 | 11.00 | 39.00 |
| AB | 50.00 | 15.00 | 35.00 |
| AC | 50.00 | 18.00 | 32.00 |
| AD | 60.00 | 11.00 | 29.00 |
| AE | 64.00 | 14.00 | 22.00 |
| 20D | 40.00 | 20.00 | 40.00 |
| 20E | 45.00 | 20.00 | 35.00 |
| 20F | 50.00 | 20.00 | 30.00 |
| 20G | 55.00 | 20.00 | 25.00 |
| 20H | 60.00 | 20.00 | 20.00 |
| 20I | 65.00 | 20.00 | 15.00 |
| 30B | 40.00 | 30.00 | 30.00 |
| 30C | 45.00 | 30.00 | 25.00 |
| 30D | 50.00 | 30.00 | 20.00 |
| 30E | 55.00 | 30.00 | 15.00 |
| 30F | 60.00 | 30.00 | 10.00 |
| 40C | 40.00 | 40.00 | 20.00 |
| 40D | 45.00 | 40.00 | 15.00 |
| 40E | 50.00 | 40.00 | 10.00 |
| AS1 | 36.30 | 36.10 | 26.10 |
| AS2 | 37.30 | 36.10 | 27.60 |
| AS3 | 36.30 | 36.10 | 27.60 |
| 15A | 40.00 | 15.00 | 45.00 |
| 25A | 40.00 | 25.00 | 35.00 |
| 22.5A | 40 | 22.5 | 37.5 |
| EUT12 | 39.00 | 32.00 | 29.00 |
| CBS-1 | 40.00 | 10.00 | 50.00 |
| CBS-2 | 46.00 | 10.00 | 44.00 |
| CBS-3 | 37.78 | 15.00 | 47.22 |
| CBS-4 | 43.44 | 15.00 | 41.56 |

For each substrate in Table I, the appearance was qualitatively assessed, and the assessment is listed in column (2). A gray appearance may indicate that binder burn off is incomplete or that a residue is left.

Edge definition is listed in column (3) and is also a qualitative assessment.

The coefficient of thermal expansion was measured as the samples were heated from room temperature to 300° C., 500° C. and 800° C., respectively. The value of the coefficient is a reflection of the compatibility of inks and the like used for alumina technology and transferable to the present invention. For alumina, CTE300 is about 64, and CTE800 is about 78 to 80.

The K value in column (5) is the dielectric constant, and the D in column (6) is the dissipation factor or dielectric loss, both measured at 10 megahertz by known techniques.

Porosity in column (7) was qualitatively assessed.

Sx and Sy in column (8) are shrinkage measurements made in the x and y directions of a CMC substrate. For isotropic shrinkage, Sx should be as close to Sy as possible.

Column (9) gives the glass phases found in a given substrate as assessed by X-ray diffraction. CS refers to a $CaOSiO_2$ phase; CB refers to a $CaOB_2O_3$ phase; G refers to a glassy residue phase; C2B refers to $2(CaO)B_2O_3$; C2S refers to $2(CaO)SiO_2$ phase; C2BS refers to $2(CaO)SiO_2B_2O_3$; alpha Q refers to alpha quartz; and U refers to undeterminable peak. The notion (M) indicates that phase is present in a major amount; (m) indicates that phase is present in a minor amount; and (t) indicates a trace amount of that phase.

Ingredient FS was a fused silica having a average powder size of 5 μm. Vycor is about 96% silica, 3% $B_2O$ and about 1% soda (available from Corning Glass).

The Vycor used in the preparation of the CMC substrates of Table I had been leached of the soda.

Ingredient "7070" is a non-crystallizing glass available from Corning Glass and believed to have a composition similar to "EJ-70," available from Ferro Corporation and having a composition by weight percent, of at least about 60% $SiO_2$, about 10 to 35% $B_2O_3$, and up to about 6% alkali metal oxide. "EJ-70" has a composition of 71% $SiO_2$, 26% $B_2O_3$, 0.5% $Na_2O$, 1.0% $K_2O$, 0.5% $Li_2O$.

Group I of substrates on Table I were prepared from single crystallizing glasses selected from the $CaO$-$B_2O_3$-$SiO_2$ system bounded by the region about 0 to 50% $B_2O_3$, about 35 to 65% CaO, and about 10 to 65% $SiO_2$. A noted previously, the composition of the individual glasses used to make the substrates is given in Table II.

Substrates in Group II on Table I were prepared from two glasses selected from the $CaO$-$B_2O_3$-$SiO_2$ system bounded by the same limits. Each of the glasses of the pair is a crystallizing glass.

The third, Group III of substrates on Table I was prepared from a crystalline glass from the above mentioned area of the $CaO$-$B_2O_3$-$SiO_2$ system and a non-crystallizing glass from another system, such as fused silica, a hard non-crystallizing glass, leached Vycor, and "7070."

It is contemplated that other non-crystallizing glasses, both hard and soft, from other glass systems will be found useful in combination with a glass or glasses from the $CaO$-$B_2O_3$-$SiO_2$ system. Such glasses can alter the speed of crystallization in a known manner. Also, the incorporation of crystallizing agents is contemplated to affect the degree of crystallization of a particular substrate.

It is contemplated that low dielectric constant fillers, such as mullite, cordierite and fosterite, and the like, will be satisfactorily incorporated into the dielectric material in a manner and with results known in the art.

2. Thick film pastes.

Figure 1B:
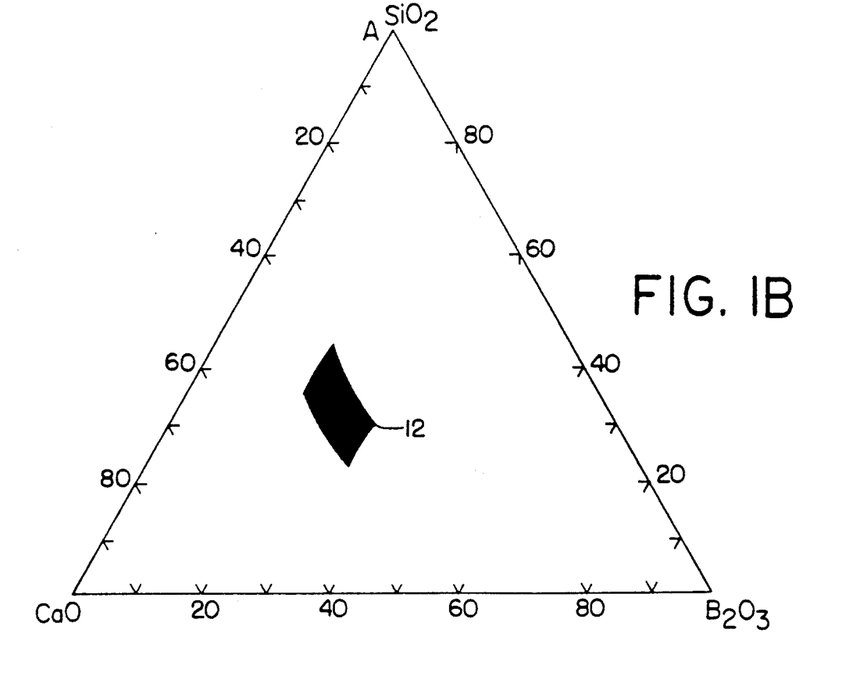
FIG. 1B is the phase diagram of the $CaO-B_2O_3-SiO_2$ system showing the range for the thick film substrates.

The composition of the crystallizing glass of the thick film pasts lies in the shaded region of the $CaO$-$B_2O_3$-$SiO_2$ glass system shown in FIG. 1B.

Thick film compositions are prepared by mixing inorganic powder of the appropriate size with an organic liquid. Any inert liquid can be used as the organic vehicle or dispersing medium in the practice of the invention. Water or any one of a variety of organic liquids, with or without thickening or stabilizing agents or other additives as are known in the art, such as surfactants and plasticizers, can be used. Typical of such organic liquids are the aliphatic alcohols, their esters, for example the acetates and propionates; terpenes such as pine oil, terpineol and the like, solutions of resins such as the poly methacrylates of lower alcohols, or solutions of ethyl cellulose, in solvents such as pine oil, the monobutyl ether of ethylene glycol monoacetate, and Carbitol. Plasticizers such as dimethylphthalate, dibutyl phthalate, and various other phthalates could be employed. Suitable surfactants are sold under the trademarks Triton, Solsperse, and Duomeen. The vehicle or medium can contain or be composed of volatile liquids to promote fast setting after application of the paste to the substrate.

A typical organic vehicle is composed as follows, the percentages being given by weight:

| | |
|---|---|
| Solvent(s) | 65 to 90% |
| Plasticizer | 0 to 30% |
| Thixotropic | 0 to 5% |
| Resin | 4 to 10% |
| Surfactant | 0 to 5% |

EXAMPLE 2

332 grams of glass flakes of the preferred glass from the $CaO-B_2O_3-SiO_2$ system having a composition of about 26% $B_2O_3$, about 42% CaO, and about 32% $SiO_2$ (Ferro Corporation Lot No. RC-5889-2) were charged into an alumina lined ball mill having a volume of 1450 ml and containing 1479 grams of a ½ inch sintered alumina medium. 254 ml of isopropyl alcohol were added to the mill. The mill was then closed and rotated at 71 rpm on two rubber rolls for 72 hours. After this period of time, the particle size was measured and found to be 3.71 μm. The glass powder slurry from the mill was dried at 60° C.

271 grams of glass flakes of the preferred non-crystallizing glass having a composition of about 71% $SiO_2$, 26% $B_2O_3$, 0.5% $Na_2O$, 1.0% $K_2O$, 0.5% $Li_2O$, and 1% $Al_2O_3$ (available from the Ferro Corporation as glass EJ-70) were charged into an alumina lined ball mill having a volume of 1450 mil and containing 1479 grams of ½ inch sintered alumina media. 254 ml of isopropyl alcohol were added to the mill. The mill was closed and rotated at 71 rpm on two rubber rollers. The milling was continued for 46 hours. At the end of this period, the particle size was assessed to be 3.1 μm. The slurry was dried at 60° C.

10 grams of EJ-70 glass, 10 grams of RC-5889-2 glass and 2 grams of $CaB_2O_4$ having an average particle size of about 1 to 3 μm were mixed together in a small ball jar mill with isopropyl alcohol. The slurry was poured out and dried at 60° C. The 13.5 grams of the dried powder were mixed with 6.5 grams of an organic vehicle having the following composition, by weight percent: 80% Texanol (available from Eastman Kodak Chemicals), 3.88% ethyl cellulose, 0.91% Thixatrol-ST (available from NL Chemicals), 9.2% Solsperse (available from ICI America, Inc.), and 2.99% m-pyrol. The dielectric powder was mixed with the organic vehicle in a paint shaker.

A paste was prepared by passing the resultant mixture four times over a 3 roll mill.

EXAMPLE 3

Figure 2:
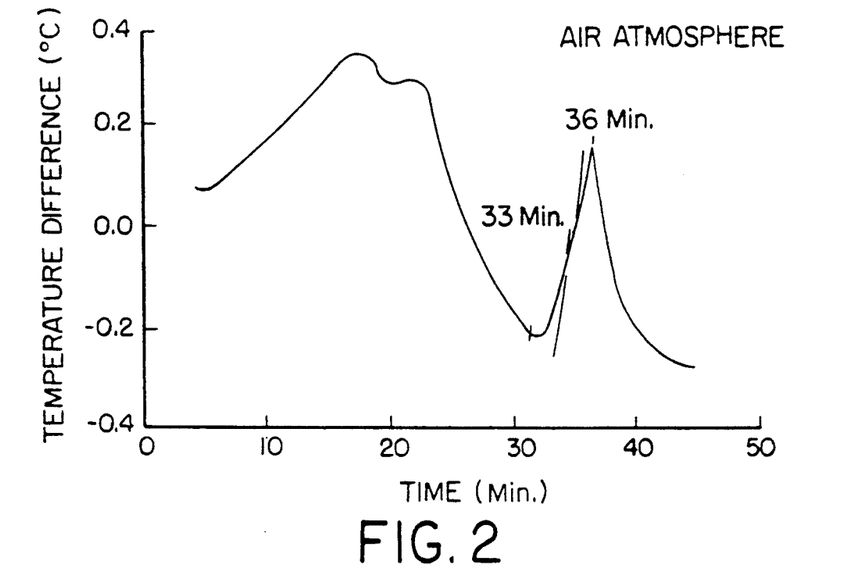
FIG. 2 is a thermogram of the dielectric paste composition of the present invention.

A paste as in Example 2 was prepared to demonstrate that to avoid entrapment of the organic vehicle, it is essential that the vehicle be volatilized before glass sintering occur. FIG. 2 is a thermogram of the paste composition of Example 2 on an alumina substrates. FIG. 2 shows that the organic phase is completely volatilized in air before 550° C. The volatilization temperature is lower than the 680° C. glass-transition temperature of the dielectric composition. Since under typical nonisothermal thick film processing conditions there is no significant sintering below the glass transition temperature, the organic phase is volatilized well before it can be trapped.

EXAMPLE 4

Figure 3:
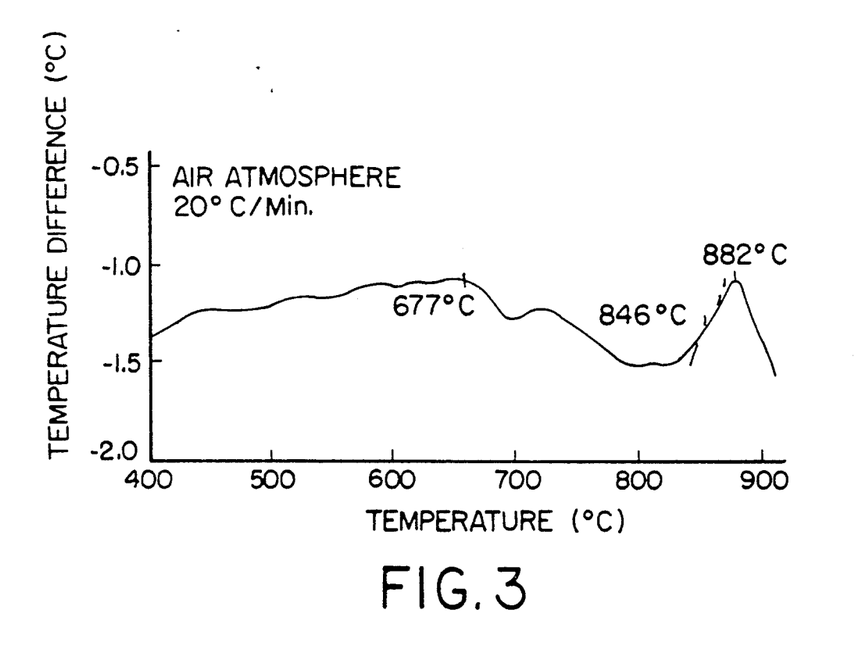
FIG. 3 is a graph of a differential thermal analysis of the dielectric paste composition of the present invention.
Figure 4:
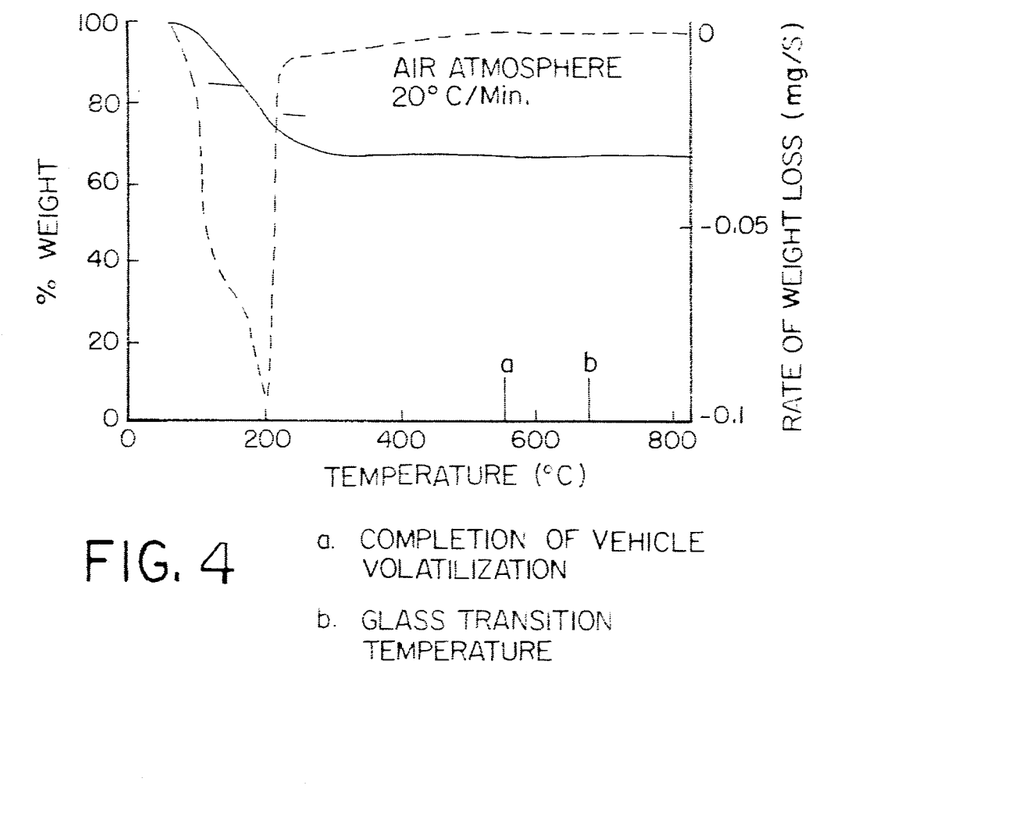
FIG. 4 is a graph like FIG. 3.
Figure 5:
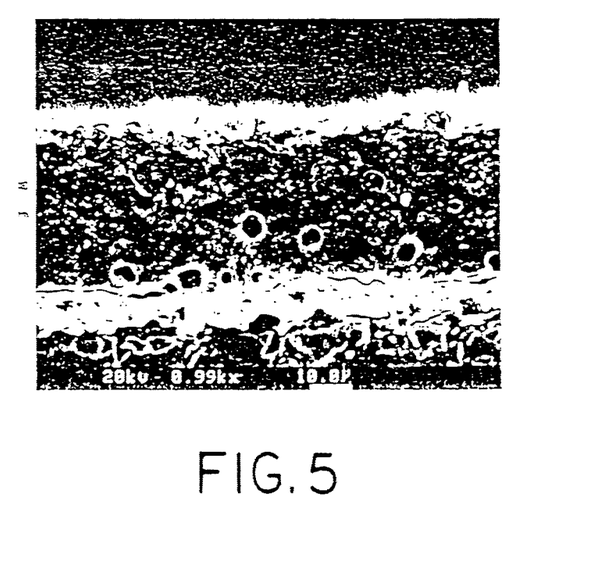
FIG. 5 is a photomicrograph of the dielectric paste composition of the present invention.

The paste of Example 1 was prepared and used to demonstrate that to obtain a dense dielectric, it is important that the crystallization occur after the densification of the glass. FIG. 3 is a differential thermal analysis (DTA) of the formulation of Example 2 on an alumina substrates. The DTA was performed at 20° C. per minute in an air atmosphere. FIG. 3 shows an endothermic step due to a glass transition at 677° C. and an exothermic peak due to crystallization at 882° C. In comparison, FIG. 4, which is a DTA graph of the same formulation carried out in an air atmosphere by heating the material from 500° C. to 850° C. at 10 C per minute, and then holding at 850° C. for 10 minutes. The onset of an exothermic peak due to crystallization occurs at 32 minutes (820° C.), and the maximum peak is reached at 36 minutes, which is one minute after the peak temperature was reached. This demonstrates the ideal crystallization behavior which resulted in the dense microstructure shown in FIG. 5. The photomicrograph of FIG. 5 was taken at 1000× at 20Kv with a scanning electron microscope.

EXAMPLE 5

Dielectric pastes were prepared by and in the proportions listed in Table III. The glasses A and B were processed by known milling techniques as in Example 2 to an average powder size of 3 to 6 μm.; component C was likewise processed to an average powder size of 1 to 3 μm.

Glass A was the preferred crystallizing glass having a composition of, by weight, about 26% $B_2O_3$, about 42% CaO, and about 32% $SiO_2$ ( Ferro Corporation lot no. RC-5889-2).

Glass B was the preferred non-crystallizing glass having a composition of, by weight, about 71% $SiO_2$, 26% $B_2O_3$, 0.5% $Na_2O$, 1.0% $K_2O$, 0.5% $Li_2O$, and 1% $Al_2O_3$ (available from the Ferro Corporation as glass EJ-70).

Component C was the preferred crystallizing agent $CaB_2O_4$.

The colorant, when added, was either chromium oxide or a commercially available colorant, as are known in the art.

The pastes were printed on to an alumina substrate using a 200 mesh screen with a 1 mil emulsion. The pastes were dried at 100° C. for 7 minutes after leveling at room temperature for 5 to 10 minutes. The pastes were fired at 850° C. for 10 minutes with a 30 minute total cycle time in an air atmosphere. In each case, two dielectric layers were printed, dried and fired separately between the top and the bottom conductors. 3066 gold paste, available from Ferro Corporation, Cleveland, Ohio, was used as a conductor for initial evaluation of the dielectric properties The thickness of the samples was about 35 to 40 μm.

The microstructure of the resulting fired dielectrics was assessed by examining a cross-section under a sem microscope, as described in Example 4, above.

The dielectric constant (k) and the dissipation factor measurements were made using a Model 1658 General Radio Bridge at 1 kHz.

The frequency dependence of the dielectric properties was studied using a Model 4192A Hewlett Packard bridge.

Breakdown voltage was measured by increasing the DC voltage across the sample until breakdown occur.

Leakage current was measured by using a standard electrolytic hermeticity test configuration in a 1 normal NaCl solution with 10 volts applied for 5 minutes.

Warpage was measured using a standard test pattern and measured with a drop-dial gauge.

Warpage was measured on a sample having the composition LK-llH on Table III.

TABLE III

| Formulation | COMPOSITION (LOT) | | | | PROPERTIES | | | | |
|---|---|---|---|---|---|---|---|---|---|
| | EJ-70 | RC-5889-2 | CaB$_2$O$_4$ | Color | k | tan δ | BDV V/mil | $I_L$ μA/cm$^2$ | Micro-Structure |
| LK-2 | 20 | 70% | 1% | 0% | 4.8 | 0.11% | 1109 | 0.00–6 | Dense |
| LK-5 | 30 | 70% | 0 | 0 | 4.8 | 0.13 | 871 | N/A | Dense |
| LK-6 | 30% | 70% | 0% | 0% | 3.3 | 0.13 | 852 | N/A | Big Pores |
| LK-7 | 60% | 40 | 0% | 0% | 5.8 | 0.19 | 1143 | N/A | Dense |
| LK-8 | 40% | 60% | 0 | 0 | 5.03 | 0.18 | N/A | | Dense |
| LK-9 | 60% | 40% | 0 | 0 | 4.5 | 0.2 | 961 | N/A | Dense with few pore |
| LK-9A | 59.5 | 39.5 | 1 | 0 | 4.83 | 0.18 | 1016 | N/A | |
| LK-10 | 59.5% | 39.5 | 1 | 0 | | | | | |
| LK-11 | 49.5% | 49.5 | 1 | 0 | 4.42 | 0.115 | N/A | | |
| LK-11 | " | " | | | 4.42 | 0.10 | N/A | | |
| LK-12 | 39.5 | 59.5 | 1 | 0 | | | | | |
| LK-13 | 59.5 | 39.5 | 1 | | | | | | |
| LK-11-4E | 48.54 | 48.54 | 0.97 | 1.94 | | | | | |
| LK-10-4E | 53.0 | 44 | 0.97 | 1.94 | | | | | |
| LK-11-3(c) | 48.54 | 48.54 | 0.97 | 1.94 | 5.13 | 0.58 | 979 | N/A | |
| LK-10-4G | 49.64 | 49.04 | 0.98 | 1.00 | | 0.2 | >1500 | | |
| LK-11-4G | 49.64 | 49.04 | | | | 0.2 | | | |
| LK-11-BC | 49.54 | 49.51 | 4 | | 4.89 | 0.11 | 770 | | |
| LK-11-Cr$_2$O$_3$ | 49.25 | 49.25 | 1 | Cr$_2$O$_3$ 0.5% | | | | | |
| (Milled together) NM428A | 49.25% | 49.25% | 1% | Cr$_2$O$_3$ 0.5% | 4.57 | 0.31 | 990 | | |
| (Separate) NM428B | 49.25% | 49.25% | 1% | 0.5% | 4.39 | 0.22 | 1036 | | |
| NM428C | 47.75% | 47.75% | 4% | 0.5% | 5.00 | 0.18 | >1009 | | |
| LK-11A | 49.5% | 49.5% | 1% | 0 | 4.82 | 0.20 | 580 | N/A | V. Dense |
| LK-11C | 49.5% | 49.5% | 1% | 0 | 5.0 | 0.19 | 653 | | V. Dense |
| LK-11D | 49.5% | 49.5% | 1% | 0 | 4.96 | 0.18 | 1378 | | V. Dense |
| LK-11F | 49.5% | 49.5% | 1% | 0 | 5.58 | 0.19 | 435 | | V. Dense |
| LK-11G | 49.5% | 49.5 | 1% | 0 | 4.5 | 0.19 | N/A | | N/A |
| LK-11E | 49.5% | 49.5% | 1% | 0 | 4.8 | | | | |
| LK-11 | 49.5% | 49.5 | 1% | 0 | 4.9 | | | | |
| LK-11-2B | 49.5% | 49.5% | 1% | 0 | 4.35 | 0.25 | 586 | | Dense 150-pore |
| LK 11-2E | 49.5% | 49.5% | 1% | 0 | 4.33 | 0.22 | 560 | | Dense 150-pore |
| LK 11-2F | 49.5% | 49.5% | 1% | 0 | 4.04 | 0.1 | 731 | | Dense |
| LK 11-2H | 49.5% | 49.5% | 1% | 0 | 3.76 | 0.08 | 944 | | Porous |
| LK 11-3E | 49.5% | 49.5% | 1% | 0 | 4.95 | 0.17 | 600 | | V. Dense |
| LK-11-3E 400° C. (C) | 49.5% | 49.5% | 1% | 0 | 4.95 | 0.15 | 762 | | V. Dense |
| LK-11 3E | 49.5% | 49.5% | 1% | 0 | 4.88 | 0.3 | >1793 v/m | | V. Dense |
| LK-11 3E (C) | 49.5% | 49.5% | 1% | 0 | 4.9 | 0.2 | >1679 | | |
| LK-11-3H | 49.5% | 49.5% | 1% | 0 | 4.4 | 0.3 | >1622 | | Dense with less pores |

TABLE IV

| | |
|---|---|
| Dielectric constant at 1 kHz | 4.5–5.2 |
| Dissipation factor at 1 kHz | <0.003 |
| Insulation resistance at 200 v D.C. | >10$^{11}$ Ω |
| Breakdown voltage (D.C.) | >1000 v/mil |
| Warpage at 10 layers | <1 mil/inch |
| Leakage current at 2 layers | <10 μA/cm$^2$ |

Table IV summarizes the properties of the preferred dielectric composition made in accordance with Example 2 by the method of Example 5. The dielectric properties were measured in a capacitor geometry with a 6 cm$^2$ area.

To simulate the effect of humidity in an actual working environment, the electric properties of a dielectric material made in accordance with Examples 2 and 5 were measured, the material was then submerged in boiling water for about an hour, and the properties remeasured. The properties remained unchanged by the boiling water treatment.

That the preferred dielectric formulation is suitable for use with alumina substrates is readily appreciable from the warpage data. Since warpage is governed by the coefficient of thermal expansion, small or negligible amounts of indicate that the CTE of the dielectric is matched or essentially equal to the CTE of the alumina substrate. Matching or essentially equal in this context does not necessarily require mathematical precision, only a sufficient matching to allow the dielectric ceramic and the alumina substrate to operate together as a circuit.

Many modifications and variations of the invention will be apparent to those skilled in the art in light of the foregoing detailed disclosure. Therefore, it is to be understood that, within the scope of the appended claims, the invention can be practiced otherwise than as specifically described.

We claim:

1. A composition for producing glass ceramic dielectric compositions for use in cofired multilayer circuits, said composition comprising about 60% by weight of a mixture comprising, by weight,
a) about 40% of a glass powder from the $CaO-B_2O_3-SiO_2$ system and having an average particle size of about 1 to 10 $\mu m$ and having a composition comprising 32% $B_2O_3$, about 39% CaO, and about 29% $SiO_2$;
b) about 60% of a glass powder having an average particle size of about 1 to about 10 $\mu m$ and having a composition comprising about 40% CaO, about 50% $SiO_2$, and about 10% $B_2O_3$, and about 40% by weight of an organic binder.

2. The composition of claim 1 wherein the produced glass ceramic dielectric compositions have a dielectric constant of less than about 7 at 10 megahertz.

3. A glass ceramic dielectric composition for use with an alumina substrate produced by firing a composition comprising about 70% by weight of a mixture comprising, by weight,
a) about 49.25% of a glass powder from the $CaO-B_2O_3-SiO_2$ system and having an average particle size of about 3 to 6 $\mu m$ and having a composition comprising 26% $B_2O_3$, about 42% CaO, and about 32% $SiO_2$;
b) about 49.25% of a glass powder having an average particle size of about 3 to about 6 $\mu m$ and having a composition comprising about 71% $SiO_2$, 26% $B_2O_3$, 0.5% $Na_2O$, 1.0% $K_2O$, 0.5% $Li_2O$; and
c) about 1% $CaB_2O_4$ having an average particle size of about 1 to 3 82 m; and about 30% by weight of an organic vehicle.

4. The dielectric composition of claim 27 having a dielectric constant of less than about 5.2 at 1 megahertz, a breakdown voltage of greater than about 500 volts per mil, and a tan $\delta$ of less than about 0.3%.

5. A composition for producing glass ceramic dielectric composition for use in cofired multilayer circuits, comprising water or an organic dispersing medium and at least one glass composition dispersed in said water or said organic dispersing medium, said glass composition comprising:
(a) at least one glass from the $CaO-B_2O_3-SiO_2$ system having a composition comprising up to about 55% by weight $B_2O_3$, about 35% to about 55% by weight CaO, and about 10% to about 65% by weight $SiO_2$; and
(b) at least one glass comprising in excess of about 60% by weight $SiO_2$, up to about 30% by weight $B_{23}$, and up to about 10% by weight of at least one alkali metal oxide.

6. A glass composition suitable for use in tapes for multilayer circuits and pasts for thick film hybrid circuits which upon firing form a glass ceramic dielectric composition, said glass composition comprising:
(a) about 20% to about 80% by weight of at least one crystallized glass from the $CaO-B_2O_3-SiO_2$ system having a composition comprising about 26% by weight $B_2O_3$, about 42% by weight CaO and about 32% by weight $SiO_2$;
(b) about 20% to about 80% by weight of at least one non-crystallized glass comprising about 71% by weight $SiO_2$, about 26% by weight $B_{23}$, about 0.5% by weight $Na_2O$, about 1.0% by weight $K_2O$ and about 0.5% by weight $LiO_2$; and
(c) about 1% by weight $CaB_2O_4$.

* * * * *